United States Patent
Nys et al.

(10) Patent No.: US 9,727,118 B2
(45) Date of Patent: Aug. 8, 2017

(54) MEASURING CIRCUIT AND MEASURING METHOD FOR A CAPACITIVE TOUCH-SENSITIVE PANEL

(71) Applicant: Semtech Corporation, Camarillo, CA (US)

(72) Inventors: Olivier Nys, Neuchatel (CH); Pascal Monney, San Diego, CA (US); Mathieu Hoffmann, San Diego, CA (US)

(73) Assignee: Semtech Corporation, Camarillo, CA (US)

( * ) Notice: Subject to any disclaimer, the term of this patent is extended or adjusted under 35 U.S.C. 154(b) by 21 days.

(21) Appl. No.: 14/755,343

(22) Filed: Jun. 30, 2015

(65) Prior Publication Data

US 2016/0018867 A1    Jan. 21, 2016

Related U.S. Application Data

(60) Provisional application No. 62/026,178, filed on Jul. 18, 2014.

(51) Int. Cl.
*G01R 27/26* (2006.01)
*G06F 1/32* (2006.01)
(Continued)

(52) U.S. Cl.
CPC ......... *G06F 1/324* (2013.01); *G01R 27/2605* (2013.01); *G06F 1/3231* (2013.01); *G06F 3/044* (2013.01); *G06F 3/0416* (2013.01)

(58) Field of Classification Search
CPC ........ G01D 5/24; G01D 5/241; G01D 5/2412; G06K 9/0002
(Continued)

(56) References Cited

U.S. PATENT DOCUMENTS

2003/0151572 A1* 8/2003 Kumada ............. G09G 3/3614
345/87
2008/0062022 A1* 3/2008 Melanson ............ H03M 3/464
341/143

(Continued)

FOREIGN PATENT DOCUMENTS

FR          2756048        5/1998

*Primary Examiner* — Giovanni Astacio-Oquendo
(74) *Attorney, Agent, or Firm* — Blank Rome LLP

(57) ABSTRACT

A measuring circuit connectable to a capacitive touch-sensitive panel, the panel including a plurality of sense electrodes and optionally a common guard electrode, adapted to measure variations in the instantaneous electric capacity of the sense electrodes in response to proximity to conductive bodies, wherein the sense electrodes are biased at a fixed voltage relative to the common guard electrode, the measuring circuit comprising: a power management integrated circuit comprising a voltage source generating a modulation voltage that is available at a guard terminal of the power management integrated circuit that is in electric connection with the guard electrode; one or more slave integrated circuits, each connected to a plurality of sense electrodes and comprising a Capacity-to-Digital converter or a plurality of Capacity-to-Digital converters that are operatively arranged for generating digital measure codes representing the instantaneous electric capacity of sense electrodes; a means for varying the frequency of the modulation voltage.

15 Claims, 6 Drawing Sheets

(51) Int. Cl.
*G06F 3/041* (2006.01)
*G06F 3/044* (2006.01)

(58) Field of Classification Search
USPC .............................. 324/519, 548, 661, 663
See application file for complete search history.

(56) References Cited

U.S. PATENT DOCUMENTS

| | | | |
|---|---|---|---|
| 2008/0079444 A1* | 4/2008 | Denison | G01D 5/24 324/679 |
| 2009/0204350 A1* | 8/2009 | Govil | B81C 99/0045 702/65 |
| 2014/0266262 A1* | 9/2014 | Taghibakhsh | G06K 9/0002 324/686 |
| 2015/0030217 A1* | 1/2015 | Wickboldt | G06K 9/00026 382/124 |

* cited by examiner

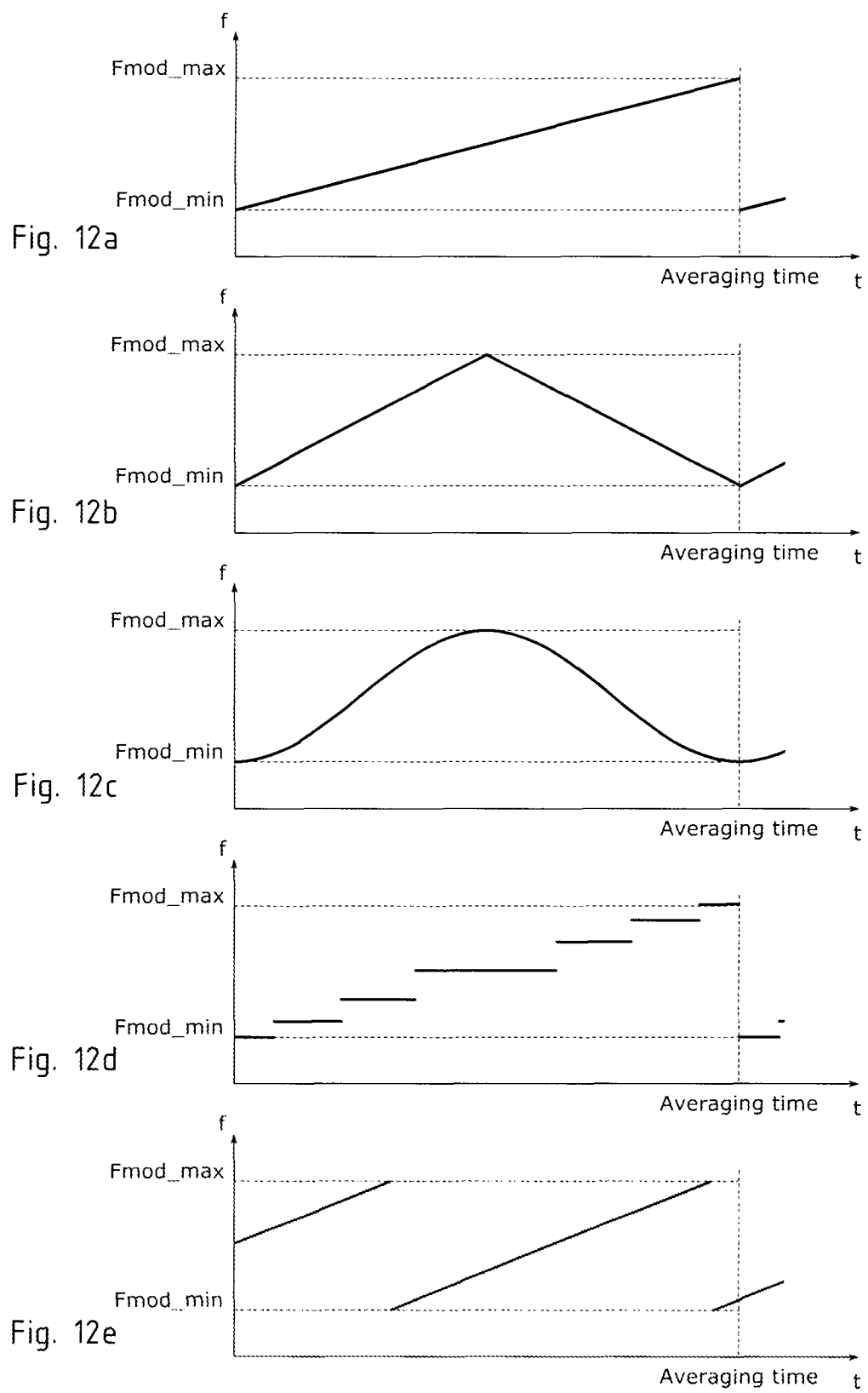

MEASURING CIRCUIT AND MEASURING METHOD FOR A CAPACITIVE TOUCH-SENSITIVE PANEL

REFERENCE DATA

The present application claims priority from U.S. provisional patent application 62/026,178 of Jul. 18, 2014, in the name of the Semtech Corporation, Camarillo, Calif., the contents whereof are hereby incorporated by reference in their entirety.

FIELD OF THE INVENTION

The present invention relates to a measuring circuit and measuring method for a capacitive touch-sensitive panel; and in particularly to a measuring circuit and measuring method for a capacitive touch-sensitive panel involving varying the modulation frequency of a modulating voltage so as to smooth the peaks in the transfer function.

DESCRIPTION OF RELATED ART

FIG. 1 describes a known technique for measuring a grounded capacitor Cin, which might be part of a touch-sensitive panel, or of a proximity detector: it consists into varying the voltage of the capacitive electrode and detecting the corresponding charge variation across Cin. This is generally achieved by tying the capacitive electrode to the negative input (virtual ground) of a charge amplifier with a capacitor Cfb in feedback. The voltage variation on the input capacitor is achieved by applying a well-defined voltage variation on the positive input of the amplifier, as the negative input will track the positive one by feedback. Since the current across the capacitor Cin only flows towards Cfb (the amplifier having high impedance inputs), the charge variation across Cin (and thus the value itself of Cin) may be determined from the voltage variation across feedback capacitor Cfb. This voltage variation can be measured directly in the analog domain, processed, or converted into the digital domain.

One drawback of this technique is its extreme sensitivity to any parasitic capacitor Cpar between electrode input node and ground, and in particular to the parasitic capacitors related to input pads, protections and parasitic capacitors of input amplifier, parasitic capacitors to supply voltages. Indeed, these parasitic capacitors may not be distinguished from the capacitor to be measured and thus affect the measurement result.

Patent FR 2 756 048 describes techniques for measurement of a grounded capacitor, as typically used for proximity detection. The advantage of these techniques lies in their precision and in that they are quite insensitive to parasitic capacitors. This is achieved by varying with respect to ground not only the voltage of the capacitive electrode but all the voltages of the measuring circuitry. All the voltages vary in the same way as the voltage of the capacitive electrode such that the voltage across the parasitic capacitors does not change. To this end, all the input circuit or charge amplifier is referred to a local reference potential, also named a local ground (typically the substrate of the measurement circuit), which is caused to vary with respect to the global ground by some excitation circuit, such the voltage source that generates the varying voltage Vin, see FIG. 2. The local ground (floating voltage VF) is thus floated with respect to the global (external) ground. The readout circuit is supplied by floating positive and negative supplies that are referenced to local ground. From measurement circuit point of view, "only" the external ground voltage is changing, all the internal circuitry being referred to floating voltage. Hence the measurement is insensitive to parasitic internal capacitors.

The capacitor Cin to be measured may be far from the measurement circuitry, however, so any parasitic capacitor between the wire connecting Cin to measurement circuit would be added to the measured capacitor. To avoid this error, the wire connecting Cin to the measurement circuitry may be uncoupled from the external ground by using a guard electrode. This guard electrode must then be connected to the internal or floating ground VF or to a node biased at a constant voltage with respect to VF, such that the capacitor between capacitive electrode and guard remain biased at a constant voltage and does not affect the measurement result. For this reason, the measurement circuitry has a guard output tied to internal ground VF or biased at a constant voltage with respect to it, and the guard of the wire between capacitor and measurement circuit should be tied to this output of the measurement circuit, see FIG. 3.

BRIEF SUMMARY OF THE INVENTION

The essential features of the present invention are recited in the independent claims of this application. Further optional, favorable, features of other embodiments are mentioned in the dependent claims.

BRIEF DESCRIPTION OF THE DRAWINGS

The invention will be better understood with the aid of the description of an embodiment given by way of example and illustrated by the figures, in which:

FIGS. 12a to 12e shows some examples of how the modulation frequency of the modulation voltage can vary.

DETAILED DESCRIPTION OF POSSIBLE EMBODIMENTS OF THE INVENTION

In a display application, typically for smartphones or tablets, the capacitive electrodes are placed on top of an LCD display and the capacitances to be measured are between these top electrodes and external ground, through the finger approaching the screen.

Only the capacitance on the upper side with respect to fingers is of interest, however, while the capacitance with respect to LCD and parasitic signals from LCD is not useful to detect finger's proximity and, indeed, the activity of the LCD is liable to inject unwanted charges in the readout circuit through the parasitic capacitors, which could false the output of the proximity detector. For this reason, a conducting guard layer is inserted between the capacitive electrodes and the LCD display. This conducting guard layer should also be tied to the guard output of the measurement circuitry, or held at a constant voltage relative to the guard output, as it was the case for the guard of the wires between touch screen and measurement circuitry.

Figure 1:
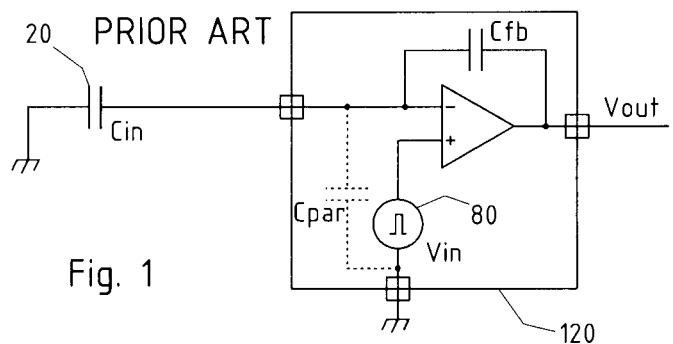
FIGS. 1 to 3 show, schematically, known circuits used in capacity measurements.
Figure 2:
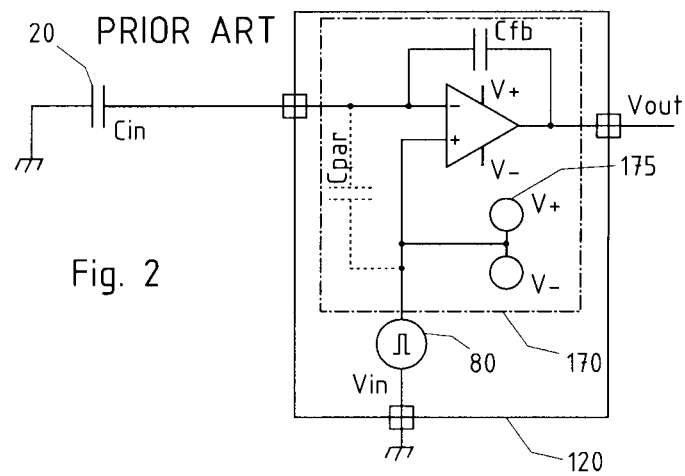
Figure 3:
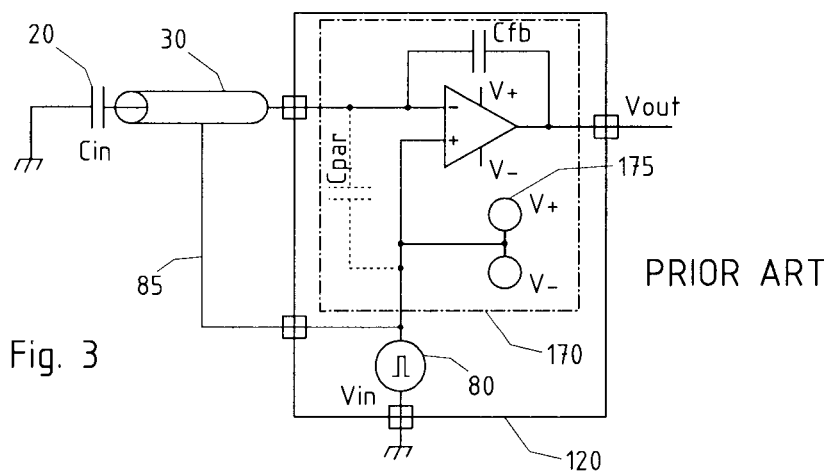
Figure 4:
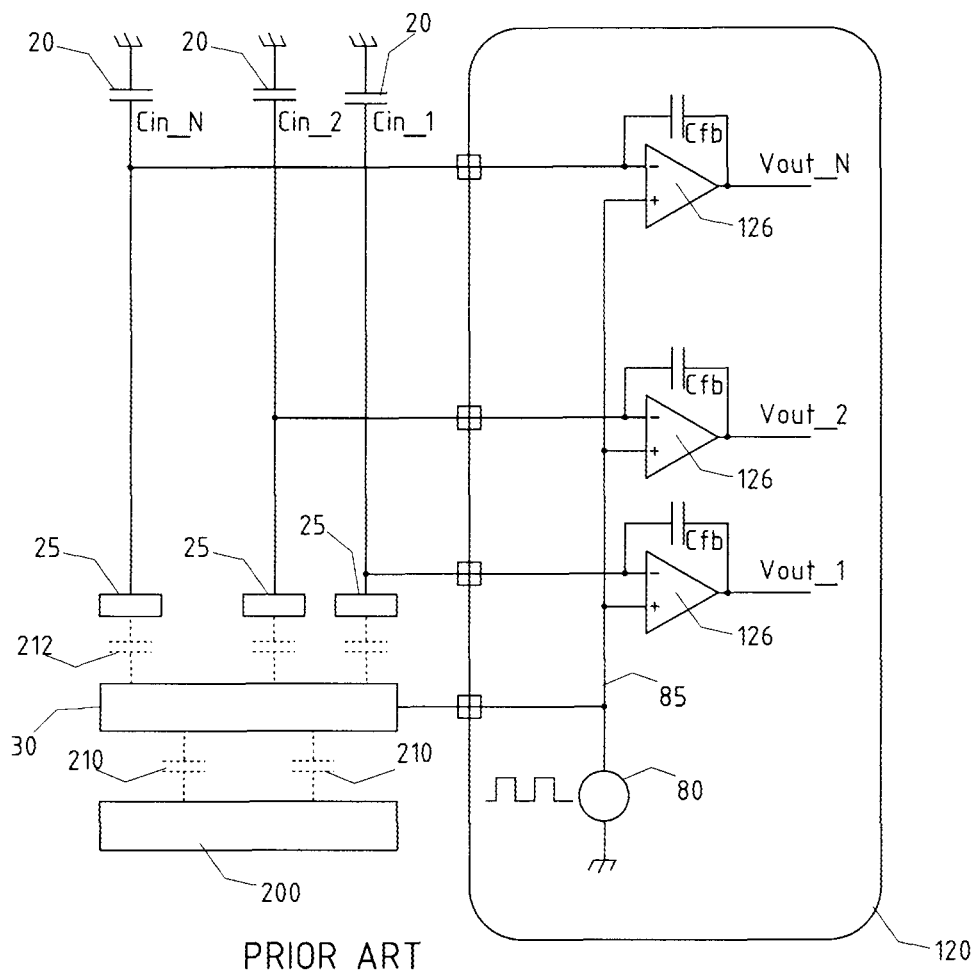
FIG. 4 illustrates a LCD panel overlaid by a transparent guard electrode, above which are placed a plurality of conductive transparent pixels, and a part of a capacity measuring apparatus.

Such an arrangement is exemplified in FIG. 4 in which a LCD panel 200 is overlaid by a transparent guard electrode 30, above which are placed a plurality of conductive transparent pixels 25 that are connected to a plurality of Capacity-to Digital Converter included in a readout circuit 120. Each CDC includes a charge amplifier 126. Since the guard electrode can be regarded as an equipotential surface, it provides an effective electrostatic screen, and unwanted interferences that may come from the LCD 200 are effectively screened by the guard potential and do not reach the CDCs.

As discussed above, the readout circuit includes a variable voltage source 80 that generates a floating reference potential 85 that is connected to the guard potential 30 and to the non-inverting inputs of the charge amplifiers 126 of the CDC. The variable voltage source could generate a square wave signal, as it is shown in the figure, or also a continuous variable waveform, like for example a sinusoid, without leaving the spirit and scope of the present invention. A square excitation may be preferable in discrete-time systems, while continuous excitation could be favored by implementation that make heavy use of analog processing.

In this configuration, the CDC stages have low-impedance virtual ground inputs and the pixel electrodes 25 are essentially held at the potential 85 of the floating reference potential. The amplitude of the signal at the outputs Vout_1, Vout_2 . . . Vout_N is proportional to the respective capacities towards ground Cin_1, Cin_2, . . . , Cin_N, seen by the electrodes 25. Importantly, the voltage across parasitic capacitors 212, which are connected between the guard electrode 30 and the pixels 25 is constant, hence these parasitic elements do not contribute to the readout.

The guard electrode 30 is useful, as explained above, for reducing the pick-up of unwanted signal generated by the LCD screen by the pixel electrodes, but it is not an essential feature of the invention, which could function even if the guard electrode 30 were omitted, provided the non-inverting inputs of the integrators 126 are connected to the floating reference potential 85. This simplified configuration would lead to a thinner touch-sensitive panel and may indeed be advantageous in specific circumstances.

It is noted also that, despite the guard electrode 30, the touch-sensitive electrodes 25 will pick up a fair deal of unwanted signals that have nothing to do with the finger capacity, either from the LCD 200 or from other interfering sources: firstly, the guard electrode 30 itself has a finite conductivity and cannot be strictly equipotential; secondly because the guard 30 is limited in size, and finally because the upper side of the electrodes 25 is not shielded at all, nor can it be, and is liable to receive interfering signals from the mobile phone itself, or from any source in proximity.

The drawing show that the reference potential 85 for the charge amplifier 126 is determined by the modulated voltage source 80 in that non-inverting inputs are directly tied to one of its terminals. The present invention is not limited to this structure, however. The reference potential 85 could be determined indirectly by the voltage source by a buffer amplifier, by a non-represented voltage source servoed or synchronised to the voltage source 80, or by any other appropriate means.

Figure 5:
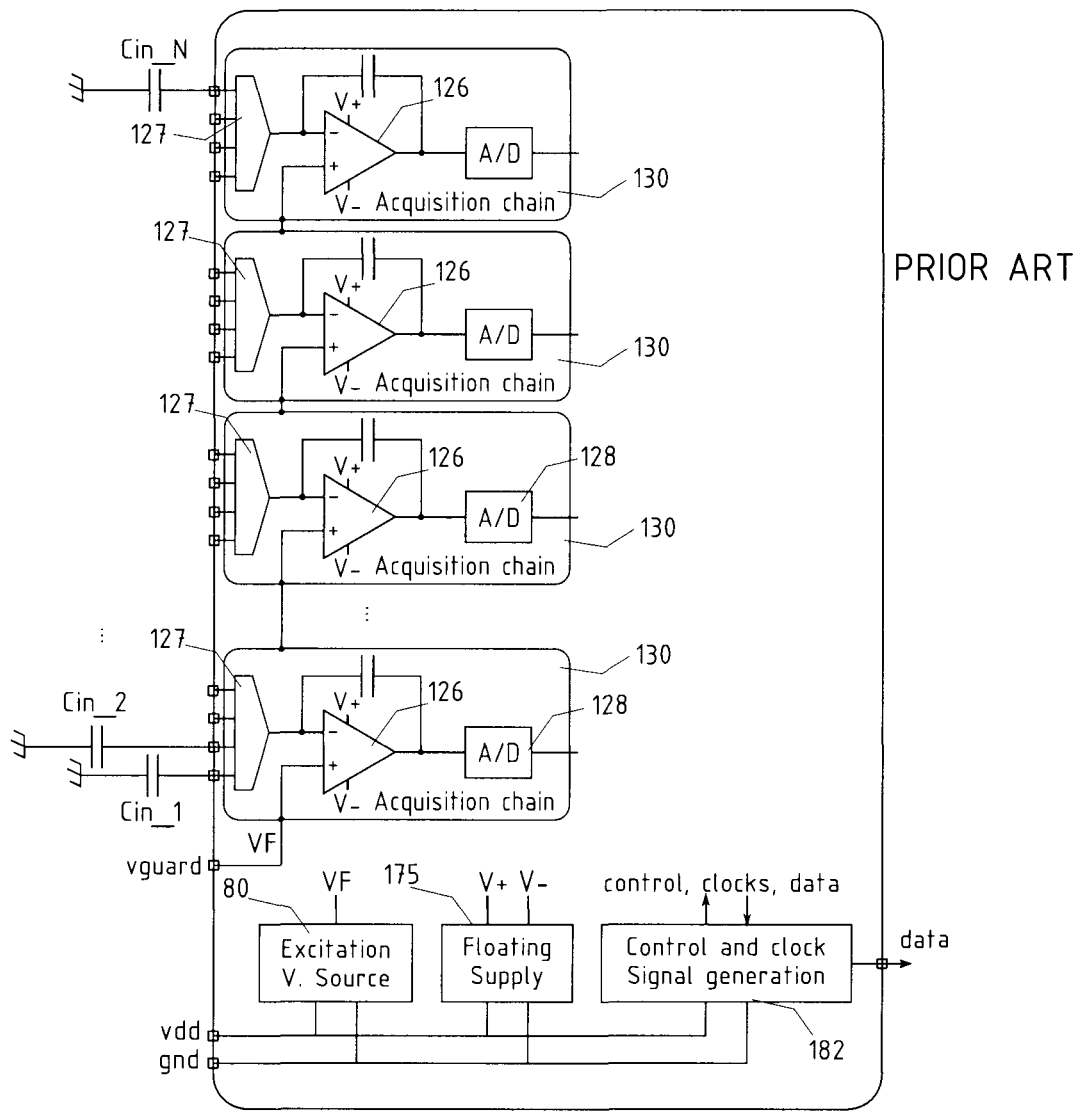
FIG. 5 shows the building blocks of a possible embodiment of the present invention.

The circuit for measuring the external grounded capacitor includes several building blocks, represented in FIG. 5:

The excitation voltage source 80, used to generate the floating node VF, or local ground, varying with respect to the global or external ground.

The acquisition and measurement circuitry for measuring the charge variation across the capacitor to be measured, and producing a signal or, preferably, a digital code that represents this capacity. Dependent on the number of capacitive input pixels this circuitry may include a plurality of independent capacity-to-digital converters 130, each referred to floating ground VF. The converters 130 may comprise a charge amplifier 126 (amplifier with feedback capacitor tied between output and negative input, and with positive input tied to floating ground VF (or guard)) and eventually other circuitry for post processing, such as analog to digital converters 128, filters, amplifiers, attenuators, or input multiplexers 127.

Generation of the supply voltages (V+, V−): since the converters 130 are referred to the floating ground, their active elements should preferably be supplied with voltage sources that are referenced to the floating ground rather than to the external ground. The floating supply unit 175 produces the required alimentations, from an external voltage supply vdd referred to external ground. The floating supply 175 may include inductive transformers, DC/DC converters of the boost or buck variety, switched-capacitor circuits, or any other voltage conversion scheme.

Generation of control and clock signals 182: many functions of the acquisition circuits need to be synchronised with the modulation signal applied between external ground and internal or floating ground. In particular the detection of the charge must be perfectly synchronous with the modulation signal. Moreover, data coming from the acquisition units 130 need to be transmitted outside the floating voltage domain.

In many applications, and particularly where touch screen and proximity detections are concerned, a large number of capacitors must be measured simultaneously or successively. In order to track the movement of a sliding finger, for example, the touch screen must be able to acquire the values of all the capacitors 25 in a short time frame. The measurement circuitry may then include several acquisition chains or acquisition circuitry in parallel 130 for measuring a large number of capacitors. A multiplexer 127 may be added in front of each measurement circuitry in order to address successively different input electrodes, one after the other, as illustrated in FIG. 5. The multiplexers 127 in front of the acquisition chains allow addressing several inputs in succession by each acquisition chain, thereby reducing the number of acquisition chains to implement on a chip.

The first block of the acquisition chain after the optional input multiplexer 127 is a charge amplifier 126. The output voltage of the charge amplifier 126 exhibits a voltage variation which is synchronous and proportional to the voltage variation applied to the floating ground node 85

(floating voltage VF or guard voltage). The variation in the output voltage of the charge amplifier 126 is also proportional to the input capacitance (Cin_1, Cin_2, . . . , Cin_N) to be detected, and is thus the signal of interest. The purpose of the A/D 128 is then precisely to measure the output voltage variation of the charge amplifier 126. This variation of the output voltage (Vout_1, Vout_2 . . . Vout_N in FIG. 4) of the charge amplifier 126 should preferably be measured in the floating supply domain, thus with respect to the floating ground (guard, V+, or V−). It must be noted that modern touch user interface require a very high resolution to the analog/digital converter 128. Converter with a resolution of 16 bits, or even higher, are not uncommon.

Since the signal generated by the charge amplifiers 126 is variable, it is preferably converted by a suitable detection means into a value proportional to or indicative of its amplitude. The detection will be adapted according to the circumstances and especially dependent from the nature of the modulation signal. Preferably, however, the detection will be synchronous with the excitation source, accepting selectively the capacity signals that are synchronous with the excitation voltage, and rejecting unwanted disturbances that are not.

If for example the excitation source 80 is arranged to generate a sinusoidal signal on the floating ground node VF, then the peak to peak amplitude of the sinusoidal signal at the outputs of the charge amplifiers 126 can be detected by suitable demodulation schemes, for instance by multiplying the output signal by the sinusoidal input signal and low pass filtering in order to eliminate the harmonics.

If on the other hand the excitation source 80 is arranged to generate a square wave signal on the floating ground node VF, then the amplitude of the square wave output signal (Vout_1, Vout_2 . . . Vout_N) of the charge amplifier 126 can be detected and measured, for example by quantifying the amplitude of the rising and falling edges. The rising and falling edges can be quantized separately, or summed up in the analog domain and quantized. Different options are possible to carry out the detection, both in the analog and in the digital domain.

However, regardless of how the input capacitor (Cin_1, Cin_2, . . . , Cin_N) is converted into a voltage variation of output voltage (Vout_1, Vout_2 . . . Vout_N) of the charge amplifier 126, this measurement will be affected by several noise i.e. perturbations, in particular but not exclusively:

Thermal noise of the circuit, basically due to resistors (4 k T R noise), MOS transistors of amplifiers (4 k T/gm noise), switches (leading to k T/C noise). This is wide band noise with approximately flat noise spectral density (white noise), and Interferers, parasitic signals coupling to the electrodes, for instance due to 50/60 Hz power network, parasitic signals due to battery chargers.

An effective way to attenuate these perturbations is to repeat the measurement several times and at a rate considerably faster than the target frame rate, and to average this oversampled results in order to filter out the perturbing signals and obtain a signal with less noise, and a lower bandwidth. The averaging can be a direct (un-weighted) averaging (sum of the samples divided by number of samples), or a weighted averaging (different samples having different weights when averaging).

In any case, this averaging corresponds to a low-pass filtering. In order to reduce the filter bandwidth and thus to eliminate most of perturbations, it is desirable to average the measurement over a large number of cycles of the modulation signal (signal modulating the floating ground). The bandwidth is then indeed inversely proportional to the number of averaged modulation cycles.

Since, by averaging, the overall duration of the measurement is proportional to the number of modulation cycles times the period of the modulation cycle, and the bandwidth is inversely proportional to the overall measurement time, there is a trade-off between the conversion rate or frame rate on one side, and the rejection of external perturbation outside a narrow band on the other side. The corner frequence of the filter used cannot be lower than the frame rate.

The averaging of the variation of the output signal (Vout_1, Vout_2 . . . Vout_N) of the charge amplifier 126 over the different modulation cycles can be done in different ways. The filter used may be, within the frame of the invention, any suitable low-pass filter, be it an analog filter, a discrete-time analog (switched-capacitor) filter, a digital filter, or a combination thereof.

Figure 6:
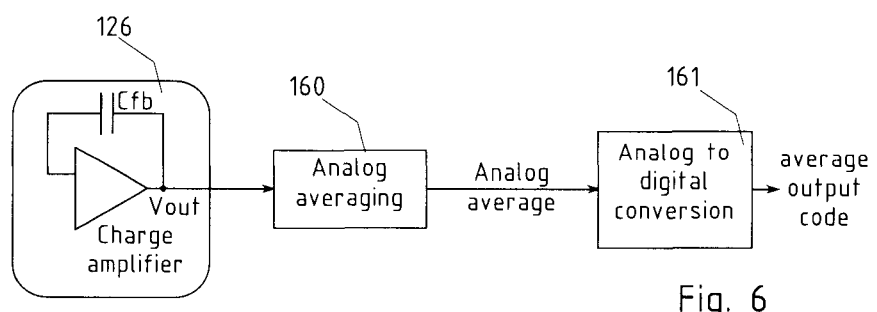
FIGS. 6 and 7 illustrate in a schematic fashion two possible manners of averaging the variation of the output signal of the charge amplifier over different modulation cycles.

A first exemplary solution is illustrated in FIG. 6; this first solution includes performing the averaging 160 of the output of the charge amplifier 126 in the analog domain and then performing analog-digital conversion 161. The drawback of this solution is that realizing this averaging on a narrow bandwidth with an analog low pass filter requires large capacitors and resistors, and thus a large area. Another drawback is that it requires a high resolution ADC, also leading to a large area.

Figure 7:
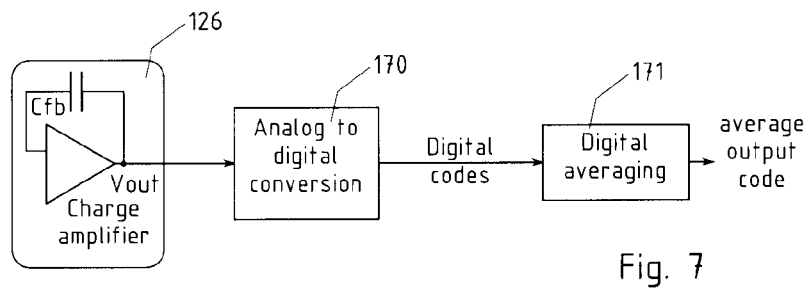

A second exemplary solution is illustrated in FIG. 7; this second solution comprises first performing analog to digital conversion 170 of the output of the charge amplifier 126, and then performing the averaging in the digital domain within the digital averaging block 171. The advantage of this second solution is that that the digital filtering can be realized efficiently, with low silicon area. However, disadvantageously a high resolution ADC is still required.

Figure 8:
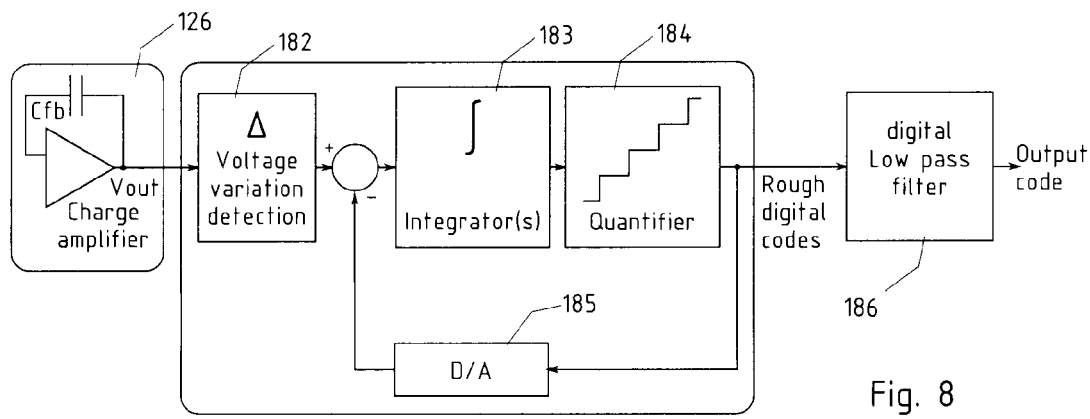
FIG. 8 illustrates a third circuit for averaging the variation of the output signal of the charge amplifier that makes use of a delta-sigma modulator.

The third exemplary solution is to use a delta-sigma analog to digital converter (ADC converter) or an incremental ADC in order to perform the analog to digital conversion. These types of ADC converters are especially suited to this application thanks to their ability to achieve a high resolution with a relatively low silicon area. These types of converters can as well include a digital postfilter that simultaneously perform the required averaging. An example of the third solution is illustrated in FIG. 8, using a first order sigma delta modulator 181; however it will be understood that higher order sigma delta modulators are possible. An incremental ADC would be similarly structured, however, in contrast to sigma-delta ADC that convert a waveform continuously, the incremental ADC converts a predetermined number of individual samples and is then reset.

The variation in the output of the charge amplifier 126 at each modulation cycle, such as the peak to peak amplitude or the voltage edges, is first extracted by a detection unit 182. The output of this detection unit 182 is then integrated by an integrator 183 (which is preferably a switched capacitor integrator operating also at the modulation frequency, although it will be understood that other types of integrators could be used). The output of this integrator 183 is then converted by a coarse quantifier 184 (comparator or bank of comparators) into small digital codes (1 bit or a very limited number of bits) produced at the same rate as the modulation rate. These codes are then converted back into analog by a digital-to-analog converter 185 and subtracted from the input signal corresponding to the charge amplifier's output voltage variations (output of detection unit 182).

Due to the feedback loop to the input of the integrator 183, the output code is forced to match the input signal, at least for low frequencies. This means that at low frequencies the output code of the sigma delta loop is a good representation of the charge amplifier's output voltage variation. The output code is then filtered using a filter 186. Thus by filtering the output code using a filter 186, or by averaging the output code from the sigma delta loop (averaging being in fact a particular case of filtering), one obtains a digital output code which is representative of the averaged (or low pass filtered) value of the charge amplifier output voltage variation, and thus of the input capacitor. The averaging and ADC conversion are thus performed simultaneously.

An advantage of this approach is that it does not require very large capacitors in order to accumulate the signal corresponding to the charge amplifier's output voltage variation. Indeed, as soon as the accumulated signal exceeds a given level, a quantity corresponding to the output code is subtracted by the feedback path. By this fact, a limited amount of signal is accumulated even after a large number of samples, as the feedback loop manages to avoid saturation of the integrator. Thus, this accumulation does not require huge capacitors and silicon area.

Another advantage is that it is able to achieve a very high resolution with a very coarse quantifier, at the extreme with a simple comparator producing one bit at a time. Indeed, for instance by cumulating the output bit on 65536 cycles, it is possible to obtain a 16-bit resolution output code. No high precision is required for the quantifier, as the errors are compensated by the feedback loop.

In any case, whatever be the selected method for averaging, either in analog or in digital or a mixed with a sigma delta modulator, the effect is to reduce the bandwidth for noise and interferers, and this bandwidth decreases inversely proportionally with the number of averaged modulation cycles.

The averaging method is very efficient rejecting the thermal noise by reducing its effective bandwidth. The improvement with respect to interferers is not so straightforward, however. While most interferers are indeed strongly attenuated, giving a good overall improvement, some interferers falling into the effective bandwidth may be attenuated very weakly attenuated, or hardly at all. This is particular true for perturbations at frequencies equal to frequency of the modulation frequency (fmod) or very close to it, or else eventually for frequencies close to the harmonics of the modulation frequency, especially the odd-order ones.

Figure 9:
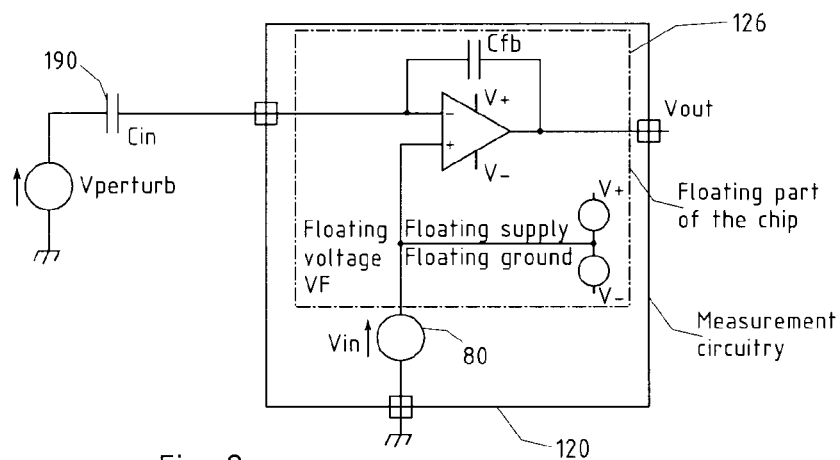
FIG. 9 illustrates a circuit wherein a perturbing voltage is perturbing the voltage on an electrode of the capacitor Cin to be detected.

FIG. 9 illustrates a case wherein a perturbing voltage Vperturb is perturbing the voltage on the left electrode 190 of the capacitor Cin to be detected. The voltage of this left electrode 190 should ideally be that of the external ground; the perturbing voltage, however, shifts its voltage level to Vperturb. As the internal ground or floating ground is moved by voltage source Vin (which is the modulating voltage signal which has a modulation frequency (fmod)) with respect to external ground, one can consider that the effective voltage applied on Cin with respect to floating ground is thus Vin-Vperturb rather than the 'nominal' Vin value. If the perturbing voltage has components at frequencies very close to that one of the modulating signal Vin, these components may not be distinguished from the modulating signal during the measurement time, that means during the time corresponding to the averaging of the different modulation cycles. In such case, these components may significantly corrupt the measurement result.

As an example of how the components of the perturbing voltage Vperturb, which have a frequency equal or close to the modulation frequency can corrupt the measurement result, let us first consider a continuous time approach in which the modulation signal Vin is a pure sinusoidal signal of amplitude Vmod at modulation frequency fmod. This will result into an output voltage Vout of amplitude (Cin/Cfb)× Vmod at the output of the charge amplifier 126 relative to floating ground 80. The value of the capacitor Cin can then be extracted by demodulating this output signal of the charge amplifier 126, which means re-multiplying by a sinusoid synchronous with Vin (same frequency fmod and same phase) and then averaging this demodulated signal in order to limit its bandwidth close to DC. A perturbing signal Vperturb may then provide a significant component close to DC at output even after averaging if its frequency is very close to that of the demodulating signal such that its phase does not shift significantly (less than one period let us say) with respect to the demodulating signal during the measurement time.

We denote with Tobs the observation time or, equivalently, the time during which the output signal is averaged after demodulation, which corresponds to N×Tmod, with Tmod being the modulation period and N the number of averaged cycles. If the frequency difference between the demodulating or modulating signal and the perturbing signal is less 1/Tobs (|f-fmod|<1/Tobs), the perturbing signal cannot be efficiently distinguished from the modulating signal and will thus significantly corrupt the result. Frequencies further from the frequency fmod are less problematic, as they look more orthogonal to the modulation frequency over the observation time.

Now, with respect to the circuit shown in FIG. 9, let us consider a discrete time approach, such as typically a switched capacitor approach, in which the modulation signal Vin is a square wave signal. For simplicity's sake we will assume that the duty cycle of the modulation signal is 50%, and that the output voltage Vout, which is also square, is sampled twice in each period of Vin, sufficiently far from the edges in order to let the charge amplifier settle correctly, as is depicted in FIG. 10.

Figure 10:
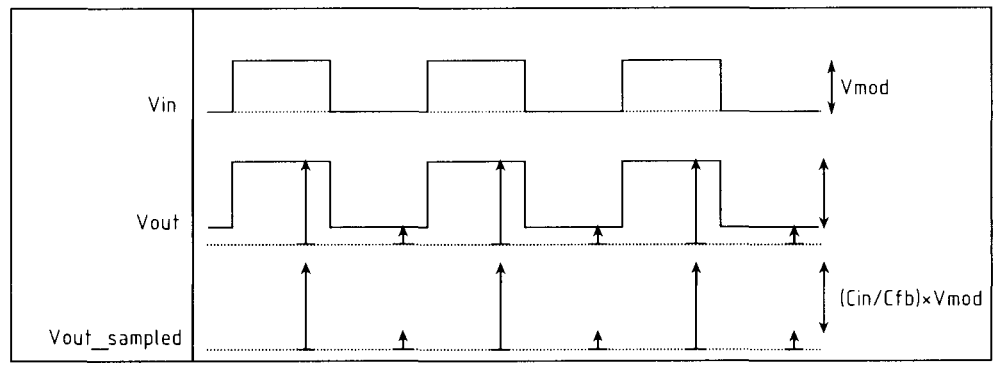
FIG. 10 illustrates a modulation voltage, output voltage and samples, which are obtained in the circuit shown in FIG. 9 when the relevant signals are sampled at discrete times.

As it can be seen in FIG. 10 all the odd samples correspond for instance to the low state and the even samples to the high state of the modulating signal Vin (or the opposite). The difference between odd and even samples thus systematically corresponds to the signal (Cin/cfb)×Vmod and is thus representative of the capacitor to be detected. The measurement then comprises extracting the average value of the difference between odd and even samples.

Computing the average difference between odd and even samples corresponds to multiply all the samples alternately by +1 or −1, thus by a signal at fs/2, which corresponds to a demodulation in discrete time, with fs=2×fmod being the sampling rate. The sensitivity is maximum at fs/2=fmod, as the signal is then inverted between each sample, which gives the maximum signal, as one computes the difference between odd and even samples.

As in the continuous time approach, the measurement will then be very sensitive to perturbing signals whose frequency is very close to the modulation frequency fmod, as odd and even samples will then be perturbed differently, provided the frequency difference between perturbing signal and modulating signal is roughly below 1/Tobs.

In the same way, the measurement is not sensitive to DC or quasi DC signals over the measurement time (f<1/Tobs), as the odd and even samples are affected the same way so that they cancel each other when demodulating by calculating the difference between odd and even samples.

Since the output signal Vout is sampled at frequency fs=2×fmod, the transfer function for the perturbing signals is periodic with period fs=2×fmod in the frequency domain.

Therefore, as the signal is insensitive to DC signals, because the signal is capacitively coupled, it will also be insensitive to all perturbing signals at k×fs=2k×fmod, that is to say, to signal having frequencies close to the even harmonics of the modulating signals. Indeed, the sampling of such a signal may not be distinguished from sampling of a DC signal.

For the same reason, as the signal presents a maximum sensitivity at fmod, it will also present maximum sensitivity for all odd harmonics of fmod, thus frequencies f=fmod+k fs=(2k+1)×fmod. For all these frequencies, the transfer function will be essentially the same as for fmod, barring a slight attenuation due to parasitic or intentional RC filtering. Thus in a discrete time (type switched capacitor approach), the rejection of perturbations will be rather poor around the modulation frequency, and also for all the frequencies very close to its odd harmonics, at least as long as these harmonics are not attenuated by other filtering effects.

Other sampling schemes with a sampled or switched capacitor approach are possible. For instance the rising and falling edges of the Vout signal, by sampling two values for each edge, one before the (rising or falling) edge and one after the edge, leading to 4 samples per modulation period. The advantage being that the noise involved by the reset of the charge amplifier between two edges can be eliminated. Moreover, due to the higher number of samples, theoretically more filtering can be performed in the discrete time. In practice, however, as more samples are taken per modulation period, the charge amplifier will need to be faster, with a larger bandwidth, and the consequence of this is that the measurement will be sensitive to further harmonics, negating at least partially the advantage of having more samples per period.

The approaches discussed with respect to FIGS. 9 and 10 present generally good rejection of interferers due to averaging. They behave poorly, however, when the interferers have frequencies very close to the modulation frequency fmod; in particular, the discrete time approach has almost no rejection for other frequencies, typically the odd harmonics of the modulation frequency fmod, which are aliased into the modulation signal baseband. The present invention aims to obviate or mitigate this problem.

In an embodiment of the present invention the modulation frequency fmod is varied when averaging the data over several modulation periods, in order to smooth the peaks in the transfer function. This effect of smoothing the peaks of the transfer function by varying the modulation frequency is depicted in FIG. 11.

Figure 11:
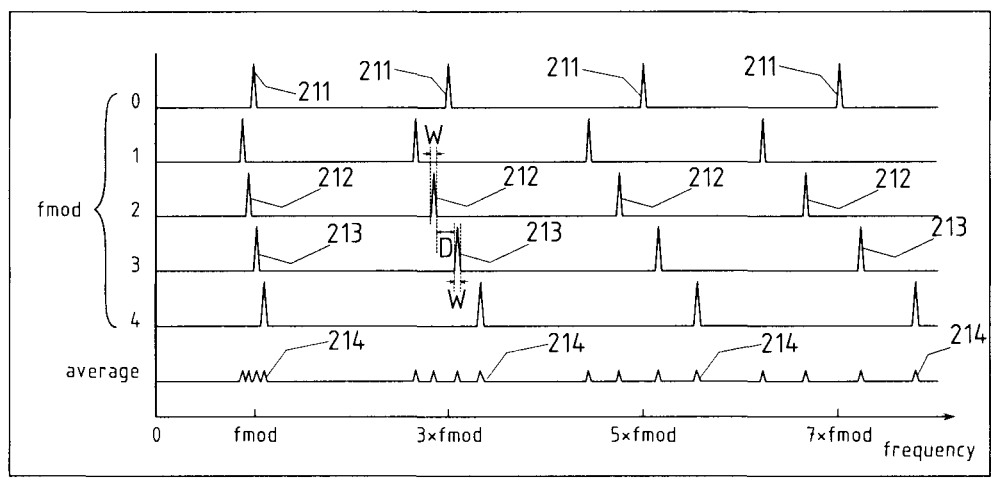
FIG. 11 show curves which depict the transfer function for perturbing signals when the modulation voltage has a fixed modulation frequency, and when the modulation voltage has a frequency varied between fmod1, fmod2, fmod3 and fmod4, and curve showing an average.

In FIG. 11 the top-most curve shows what would be the transfer function for perturbing signals when the modulation voltage has a fixed modulation frequency fmod; it can be seen that peaks 211 occurs around modulation frequency fmod and typically at all the odd order harmonics of the modulation frequency 3×fmod, 5×fmod, 7×fmod.

The four curves below the top-most curve show how this transfer function would change when varying the modulation frequency fmod slightly around its nominal value to get a frequency fmod_i (i=0 . . . 4 in this example); All these four curves are obtained by compressing or expanding the first curve along the frequency axis by a factor fmodi/fmod.

Now, let us assume that during the overall acquisition of the capacitors, the modulation frequency fmod is varied between fmod1, fmod2, fmod3 and fmod4, each of these frequencies being used for 25% of the modulation cycles. As a first approximation, one could expect that the resulting transfer function would approximately look like the average of the four previous curves, as shown in the lowest curve (the average curve). As can be seen the peak of the amplitude of the peaks 214 in the average curve are strongly attenuated (in this case roughly by a factor of 4), but the bandwidth is extended so that the bandwidth available for the perturbing signal is extended. Consequently, although the measurement becomes more sensitive to perturbing signal lying in a wider band, the averaged response function does not exhibits as pronounced peaks for any given frequency as the individual ones, and its worst-case sensitivity to interferences is lower.

Another important advantage of this variant is that the energy of the peaks 214 is much more spread for the higher order harmonics than for the fundamental. Importantly, the sensitivity to the capacity variations is essentially independent from the modulation frequency fmod, because the signal Vout is detected synchronously. Therefore, the proposed invention provides a better rejection of interferences without compromising the sensitivity tiny capacity changes.

In the above-mentioned example, only five different modulation frequencies were used. It should be understood, however that the modulation frequency could be varied in whichever manner, either by hopping between a suitable number of discrete frequencies, or in a continuous fashion.

Preferably, the modulation frequencies are optimized: very low frequencies should be avoided because they would significantly increase the averaging time and hence reduce the frame rate. Very high modulation frequencies should also be avoided because the performance would then be limited by parasitic time constants, by the speed of the charge amplifier and by that of the ADC. Moreover operating at a too high modulation frequency could require a higher current consumption.

In a preferred embodiment the modulation frequency is selected to optimise averaging time and parasitic time constants i.e. the frequency of the modulation voltage is varied only with modulation frequencies which are not so low as to cause a significant increase the averaging time, and not so high so that performance would then be limited by parasitic time constants. In this embodiment the modulation frequency is variable within a given range between a predefined minimum frequency (fmod_min) and a predefined maximum frequency (fmod_max).

In another more preferable embodiment, the difference between two consecutive modulation frequencies is optimized so that the difference is greater than the width of the peaks of the transfer function corresponding to each frequency. In the example illustrated in FIG. 11, it can be seen that the difference between consecutive modulation frequencies is greater than the width of the peaks of the transfer function corresponding to each frequency. The difference "D" between the modulation frequencies fmod3 and fmod2, for example, is greater than the width "W" of the peaks 213, 212 in the respective transfer functions corresponding to modulation frequency fmod3 and fmod2. This ensures that the peaks of the transfer functions corresponding to each of the different frequencies do not overlap. Advantageously this leads to a strong improvement in the overall transfer function when averaging or performing synchronous detection. It should be understood that the width of a peak is measured at the widest portion of the peak.

Thus, in a preferable embodiment of the present invention, the spreading of the peak in the transfer function will be significantly improved as long as the number of averaged modulation frequencies remains below (fmod_max−fmod_min)/W, for the peak around fundamental, and k×(fmod_max−fmod_min)/W for the k-th order harmonics. Selecting a higher number of modulation frequencies, the additional advantage will tend to saturate, because the individual transfer functions become more correlated, having the peaks more overlapping.

However, there is also no significant drawback in varying the modulation frequency on a given frequency range with a finer step, by selecting more frequency points. The modulation frequency can namely be selected different for each modulation cycle, or even between two consecutive sampling of input capacitor, or else swept continuously during the overall averaging time, or measurement time.

There is therefore an infinite number of possible ways of varying the modulation frequency (fmod) of the modulating voltage during the averaging time or between successive synchronous detections. For example, but not limited exclusively to these examples, in the present invention:

- The modulation frequency can vary by step or continuously, or quasi continuously (with very small steps).
- The modulation frequency can be varied randomly or pseudo randomly, or according to a predetermined algorithm.
- The variation of the modulation frequency can be identical or different for different measurement cycles.
- The variation of the modulation frequency can be a periodic function. In such a case, the period of the variation of the modulation frequency can be the same as the measurement frequency (frame rate) or different. In the first case, the modulation frequency will vary the same way for all the measurements, while in the second case not. Preferable, the periodicity of the modulation frequency at least more or less corresponds to the measurement period.

Different periodic functions that can be used to vary the modulation frequency (fmod) of the modulating voltage are shown in FIGS. 12a-e. In particular, FIGS. 12a-e shows different periodic functions that can be used to vary the instantaneous modulation frequency (fmod_inst) of the modulating voltage between predefined limits fmod_min and fmod_max during the averaging time or between successive synchronous detections.

In the graph illustrated in FIG. 12a, the instantaneous frequency fmod_inst follows a saw-tooth pattern, while FIG. 12b shows another form of linear shift, fmod_inst being swept according to a triangle function. In the graph illustrated in FIG. 12c fmod_inst is swept according to a cosinusoidal function. In the graph illustrated in FIG. 12d, fmod_inst is varied step-wise. FIG. 12d shows an example of a periodic modulation whose period does not coincide with the averaging time.

It should be understood that FIGS. 12a-e provide non-limiting examples of the possible manner in which the modulation frequency (fmod) of the modulating voltage can be varied during the averaging time or between successive synchronous detections. It must also be understood that modulation frequency (fmod) of the modulating voltage can be varied in any other suitable manner; an infinite number of other functions are possible.

In any embodiment of the present invention, the variation of the modulation frequency (fmod) of the modulating voltage can be achieved by any suitable means. As a non-limiting example, the variation of the modulation frequency (fmod) of the modulating voltage can be achieved by changing the division ratio of a clock divider in order to adapt the modulation period; and/or by acting on the frequency of an oscillator, for instance trimming of RC oscillator, control of a Voltage Controlled Oscillator (VCO).

Various modifications and variations to the described embodiments of the invention will be apparent to those skilled in the art without departing from the scope of the invention as defined in the appended claims. Although the invention has been described in connection with specific preferred embodiments, it should be understood that the invention as claimed should not be unduly limited to such specific embodiment.

The invention claimed is:

1. A measuring circuit electrically connected to a capacitive touch-sensitive panel, the capacitive touch-sensitive panel including a plurality of sense electrodes, the measuring circuit being adapted to electrically connect to the sense electrodes, and measure variations in an instantaneous electric capacity of the sense electrodes in response to proximity to conductive bodies, wherein the sense electrodes are biased at a fixed voltage relative to a common floating reference potential, the measuring circuit comprising: a power management circuit comprising a modulated voltage source generating a modulation voltage having a variable frequency that determines said common floating reference potential, one or more readout units, each connected to a subset of the sense electrodes and operatively arranged for generating signals representing the instantaneous electric capacity of the sense electrodes in the subset; a detector for generating said signals synchronously with the modulation voltage.

2. The measuring circuit of claim 1, wherein the common floating reference potential is available at a guard terminal of the measuring circuit that is electrically connected to a common guard electrode of the capacitive touch-sensitive panel.

3. The measuring circuit of claim 1, the detector including an analog/digital converter configured to sample an input signal at a frequency which is synchronized to the variable frequency of the modulating signal; and a filter arranged to average those samples over an averaging interval, wherein the averaging interval is a time interval over which a predefined number of samples have to be taken.

4. The measuring circuit of claim 3 wherein variable frequency of the modulation voltage changes 'N' times within the averaging interval, wherein 'N' is an integer value greater than '2' so that the modulation voltage has at least two different modulation frequencies within the averaging interval.

5. The measuring circuit of claim 4 wherein the 'N' frequencies to which frequency of the modulation voltage is varied, are all within a predefined frequency range.

6. The measuring circuit of claim 4 wherein the difference between two frequencies of the modulation voltage before and after a change is such that peaks of the transfer functions corresponding to each frequency do not overlap.

7. The measuring circuit of claim 3 wherein the means for varying the frequency of the modulation voltage is configured to vary the frequency of the modulation voltage in at least one of the following manners within the averaging interval: continuously; randomly; pseudo randomly; according to a predefined algorithm; and/or according to a periodic function.

8. A method for measuring variations in an instantaneous electric capacity of sense electrodes in a touch-sensitive panel, in response to proximity to conductive bodies, wherein the sense electrodes are biased at a floating reference voltage, the touch-sensitive panel including a common guard electrode, the method comprising the steps of generating a modulation voltage that determines said floating reference voltage with a voltage source comprised in a power management circuit, detecting the instantaneous electric capacity of the sense electrodes synchronously with the modulation voltage, generating signals representing the instantaneous electric capacity of the sense electrodes; varying a frequency of the modulation voltage.

9. The method of claim 8 wherein the step of including sampling an input signal at a frequency which is synchronized to the frequency of the modulation voltage; and averaging those samples over an averaging interval, wherein the averaging interval is a time interval over which a predefined number of samples have to be taken.

10. The method of claim 9 including varying the frequency of the modulation voltage 'N' times within the averaging interval, wherein 'N' is an integer value greater than '2' so that the modulation voltage has at least two different modulation frequencies between successive synchronous detections.

11. The method of claim 10 wherein the frequency of the modulation voltage is varied within a predefined frequency range.

12. The method of claim 10, including varying the frequency of the modulation voltage to provide a difference between two different frequencies of the modulation voltage before and after a change which ensures that peaks of a transfer functions corresponding to each frequency do not overlap.

13. The method of claim 12 including varying the frequency of the modulation voltage so that the difference between two different frequencies of the modulation voltage before and after a change is greater than a broadest width of peaks of the transfer functions corresponding to each of the two different frequency, such that peaks of the transfer functions corresponding to each frequency do not overlap.

14. The method of claim 9, including varying the frequency of the modulation voltage in at least one of the following manners within the averaging interval: continuously; randomly; pseudo randomly; according to a predefined algorithm; and/or according to a periodic function.

15. The method of claim 8 comprising changing the division ratio of a clock divider and/or adjusting the frequency of an oscillator.

* * * * *